(12) United States Patent
Wagner et al.

(10) Patent No.: US 7,535,750 B2
(45) Date of Patent: May 19, 2009

(54) ASYMMETRICAL RANDOM ACCESS MEMORY CELL, AND A MEMORY COMPRISING ASYMMETRICAL MEMORY CELLS

(75) Inventors: Otto Wagner, Altdorf (DE); Sebastian Ehrenreich, Schoenau (DE); Torsten Mahnke, Stuttgart (DE); Anthony Gus Aipperspach, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 185 days.

(21) Appl. No.: 11/623,443

(22) Filed: Jan. 16, 2007

(65) Prior Publication Data

US 2007/0165447 A1 Jul. 19, 2007

(51) Int. Cl.
*G11C 11/00* (2006.01)
(52) U.S. Cl. .................. 365/154; 365/156; 365/190; 365/189.11

(58) Field of Classification Search .................. 365/154, 365/156, 190, 189.11
See application file for complete search history.

(56) References Cited

U.S. PATENT DOCUMENTS 4,536,859 A * 8/1985 Kamuro ..................... 365/154
6,510,076 B1 * 1/2003 Lapadat et al. ............. 365/154

* cited by examiner

*Primary Examiner*—Son Dinh
*Assistant Examiner*—Nam Nguyen
(74) *Attorney, Agent, or Firm*—W. Riyon Harding

(57) ABSTRACT

Asymmetrical random access memory cell (1) including cross coupled inverters (2, 3) which are driven at their nodes (22, 32) by separate bit-lines (blt, blc) of a pair of complementary bit-lines, which are connected via a pass-transistor (21, 31), wherein the random access memory cell is asymmetrical by means of the cross coupled inverters (2, 3) which have asymmetrically physical behaviours whereby different switching thresholds of the inverters are present, and that the pass-transistors (21, 31) are driven by separate controlled wordlines (wl, wwl).

3 Claims, 2 Drawing Sheets

ASYMMETRICAL RANDOM ACCESS MEMORY CELL, AND A MEMORY COMPRISING ASYMMETRICAL MEMORY CELLS

CROSS REFERENCES TO RELATED APPLICATIONS

This application claims priority to European patent application number EP06100372, filed Jan. 16, 2006, currently abandoned, and assigned to the present assignee.

FIELD OF THE INVENTION

The invention relates to an asymmetrical random access memory cell comprising cross coupled inverters and it relates to a memory, further the invention relates to a method to operate such a memory.

BACKGROUND OF THE INVENTION

The increasing tightness of the chip structures leads to more and more increasing noise problems while determining the state of a Symmetrical Random Access Memory Cell (SRAM) according to the state of the art or while writing said cell. Furthermore negative side effects on neighboring cells occur.

Known solutions are cells with larger devices or more devices, especially 8T (eight transistor) cell approaches. But because of the needed massive usage of cells the area of a cell is essential. So such approaches have an inevitable drawback.

The prior art Jean-Marc Masgonty, Stefan Cserveny, Christian Piguet, "Low-Power SRAM and ROM Memories", PATMOS 2001, Yverdon-les-bains, Switzerland, Sep. 26-28, 2001, p 7.4.1-7.4.8, describes a memory cell operation of a common 6T SRAM wherein it is proposed to write it in a conventional way while using the true and inverted bit-lines, but to read only through a single bit-line to overcome noise problems on a memory design where no sense amplifiers are present. For evaluation of the stored state an circuitry controlling the complex use of the bit-lines is necessary.

The prior art Navid Azizi, Farid N. Najm, Andreas Moshovos, "Low-Leakage Asymmetric-Cell SRAM", IEEE TRANSACTIONS ON VERY LARGE SCALE INTEGRATION (VLSI) SYSTEMS, VOL. 11, NO. 4, AUGUST 2003, p. 701-715 describes asymmetric SRAM cells that reduce leakage power in caches while maintaining low access latency. A major drawback on this technique is the need of novel sense amplifier in combination with dummy bit-lines, that would be needed to allow read times to be on par with conventional symmetric cells.

SUMMARY OF THE INVENTION

It is therefore an object of the invention to avoid the extensive and therefore expensive increase of use of space on the chip to overcome the noise problems by providing a memory cell and a memory with a plurality of said memory cells together with a method to operate such a memory.

An object of the invention is met by an asymmetrical random access memory cell comprising cross coupled inverters which are driven at their nodes by separate bit-lines of a pair of complementary bit-lines, which are connected via a pass-transistor, wherein said cross coupled inverters have different switching thresholds providing asymmetrically physical behaviours and wherein the pass-transistors are driven by separate controlled wordlines. In tests it was advantageous to have a difference of about 50 mV in the switching voltages of the both inverters.

Advantageously the inverter with a gate connected to the pass transistor dedicated to conduct the read signal, is made with a higher threshold by proper rationing the device sizes of the p- to n-devices and/or a n-device with a higher Vt, the device threshold voltage, and/or a n-device with thicker oxide. This leads to drastically increased stability during a read operation. The yield of the production of chips comprising such memory cells is increased substantially i.e. when large memories are present e.g. on processor chips.

Another object of the invention is met by a random access memory comprising a plurality of said asymmetrical random access memory cells, which are arranged in columns and rows, wherein a circuitry is provided controlling the separate wordlines.

A very important benefit of the invention lies therein that the normal signal voltages can be used and that there is no need of excessive additional circuitry to evaluate the state of the memory cell. The bit-lines stay symmetrical and designs state of the art can be used.

Advantageously the known domino sensing scheme could be used to operate the memory. It could be a benefit to use a leakage compensator for reading the memory cells.

In a preferred embodiment of said memory the cells of a column are partitioned in groups, wherein the first nodes of the cells of each group are connected to a separate bit-line whereas the bit-line connected to the second nodes is common to all cells of all groups within a column.

Another object of the invention is met by a method to operate a random access memory according to said memory, wherein it is proposed that the circuitry drives during a write-cycle of the memory cell both pass-transistors so that they are switched open and that the circuitry drives during a read-cycle of the memory cell only one pass-transistor so that it is switched open.

In a preferred embodiment of the invention the circuitry drives during a read-write-back-cycle of the memory cell both pass-transistors, wherein one pass-transistor is opened first and the signal from its dedicated node is derived and fed into the bit-line, inverted and driven back to the complementary bit-line before the other pass-transistor is also opened.

The benefit that is achieved is that the cells which are intended to keep their state are read with feeding the signal from its dedicated node to the bit-line. The derived signal is amplified and inverted and driven onto the other complementary bit-line before the other pass transistor is opened according to signal wwl. Thus a write back is performed. For cells to be written the bit-line dedicated for read is forced to the level corresponding to the write data from cycle begin and in the same manner as for cells to be read the other complementary bit-line is enforced.

Another preferred step of the method proposes that the circuitry drives during a read-write-cycle of the memory cell both pass-transistors, wherein one pass-transistor is opened first and the signal form its dedicated node is derived but overwritten with forcing bit-line blt to that level which corresponds to data to be written, thereafter forced signal on bit-line blc is inverted and driven back to the complementary bit-line and after that the other pass-transistor is also opened for complete write of the memory cell.

According to another preferred step of the method it is proposed, that said circuitry performs read-write-back-cycles or write-cycles depending on a control signal to be set or not for each column of cells or a group of columns.

Now the timing applied to the memory and especially the timing on the two controlled wordlines wl and wwl is equal for read and write operations, a cell read operation is possible to be performed as read and write back operation.

In a preferred embodiment of said method according to the invention said circuitry performs a write operation of memory cells on selected columns while memory cells on other unselected columns but on the same selected row are read, which also means and that is more important, the content of the memory cells is unchanged.

For all selected cells on a row one pass transistor is opened first by wl. For cells to keep their state are read with feeding the signal from its dedicated node to blt. Signal is amplified and inverted and driven onto the other bitline blc before the other pass transistor is opened by wwl. Thus a write back is performed. For cells to be written the bitline dedicated for read bit is forced to the level corresponding to the write data from cycle begin and in the same manner as for cells to be read the other bitline blc is enforced.

To prevent the negative influence of leakage of the bit-line another preferred step of the invention proposes, that said circuitry turns on a leakage compensating device depending on the detected state of the bit-line, wherein the detection is performed after a predetermined time, wherein the leakage compensating device permanently charges the bit-line.

BRIEF DESCRIPTION OF THE DRAWINGS

The present invention and its advantages are now described in conjunction with the accompanying drawings.

DETAILED DESCRIPTION

Figure 1:
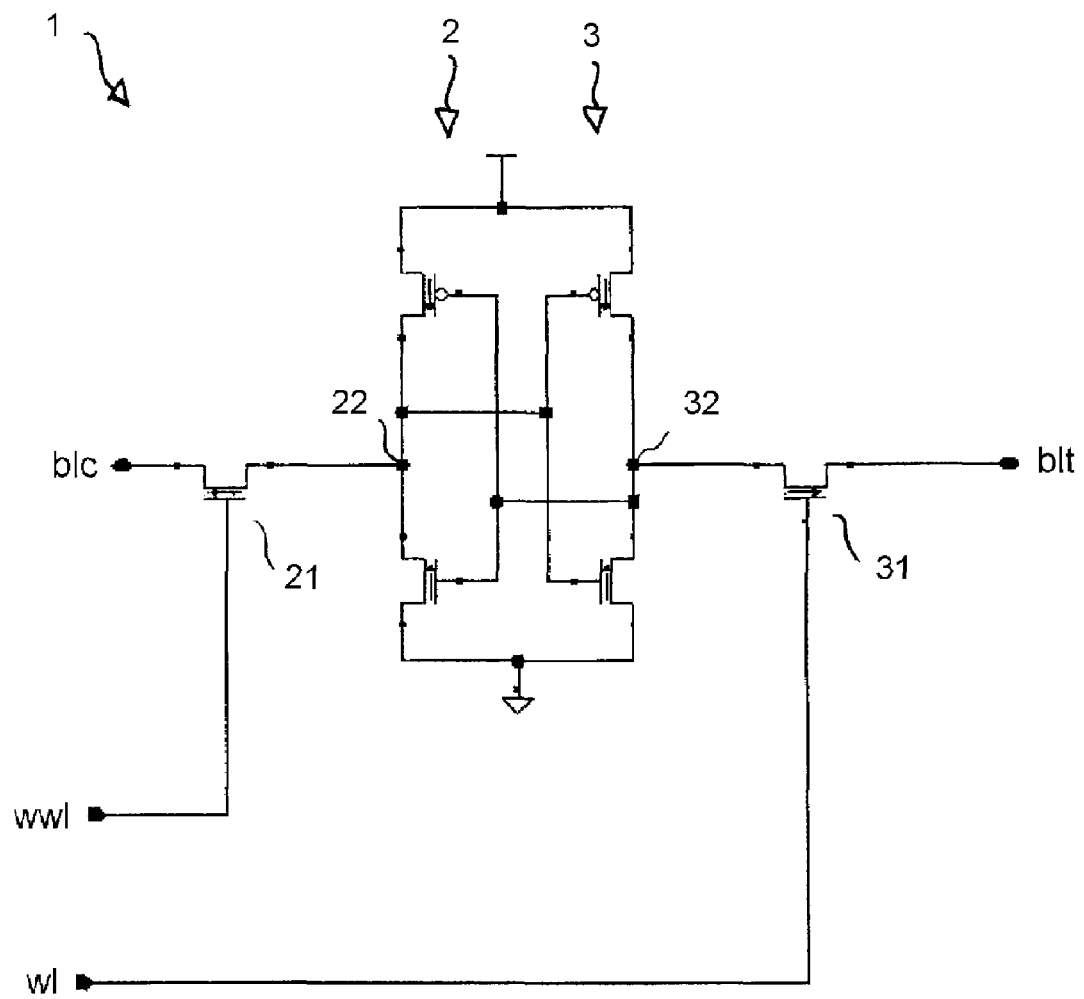
FIG. 1 shows a schematic circuit block diagram of an asymmetrical random access memory cell according to the invention.

FIG. 1 shows the proposed asymmetrical random access memory cell 1 comprising cross coupled inverters 2 and 3 which are driven at their nodes 22 and 32 by separate bit-lines blt and blc of a pair of complementary bit-lines, which are connected via a pass-transistor 21 and 31. The pass-transistors 21, 31 are driven by separate controlled word lines wl and wwl.

The random access memory cell is thereby asymmetrical by means of the cross coupled inverters 2, 3 which have asymmetrically physical behaviours whereby different switching thresholds of the inverters are present.

The memory cell is made asymmetrical and provided with two wordlines for a stable single sided read and a dual railed write. This is achieved by proper controlling of the two pass-transistors by the wordlines wwl and wl.

The feedback inverter 3 to the side of the node 32 has a higher threshold and a large margin against noise induced from the bit-line blt through the transfer device (pass-transistor 31) to the drain node of the forward inverter 2. An increased protection against voltage uplift by current supplied from charge on bit-line blt and flowing through the open transfer device (pass-transistor 31) is provided.

The left transfer device (pass-transistor 21) is connected to wordline wwl which is activated only during a write operation. Wordline wl is in contrast active during read and write.

Hence bit-line blc carries only write data, bit-line blt is used for reading and writing data.

As the left port is closed by the pass-transistor 21 during a read operation the left pull down device can be made smaller than the corresponding one. The physical parameters of the field effect transistors of the feedback inverter can be chosen and be adjusted by a smaller channel width or longer channel length, alternatively with thicker oxide and or higher device threshold (voltage Vt) to achieve a more positive threshold of the feedback inverter.

Thus noise injected during a read operation by the voltage divider of the right pull down and transfer devices is more blocked by a higher threshold.

A write operation is done as usual by pulling down bit-line blc or blt.

Present thin cells have space for two wordlines and their contacts thus the full extent of the advantages of the invention can be used. Further the cell size and designs state of the art can be maintained, which does not lead to extensive redesigns.

The proposed cell could be intended for use with the known domino sensing scheme.

Figure 2:
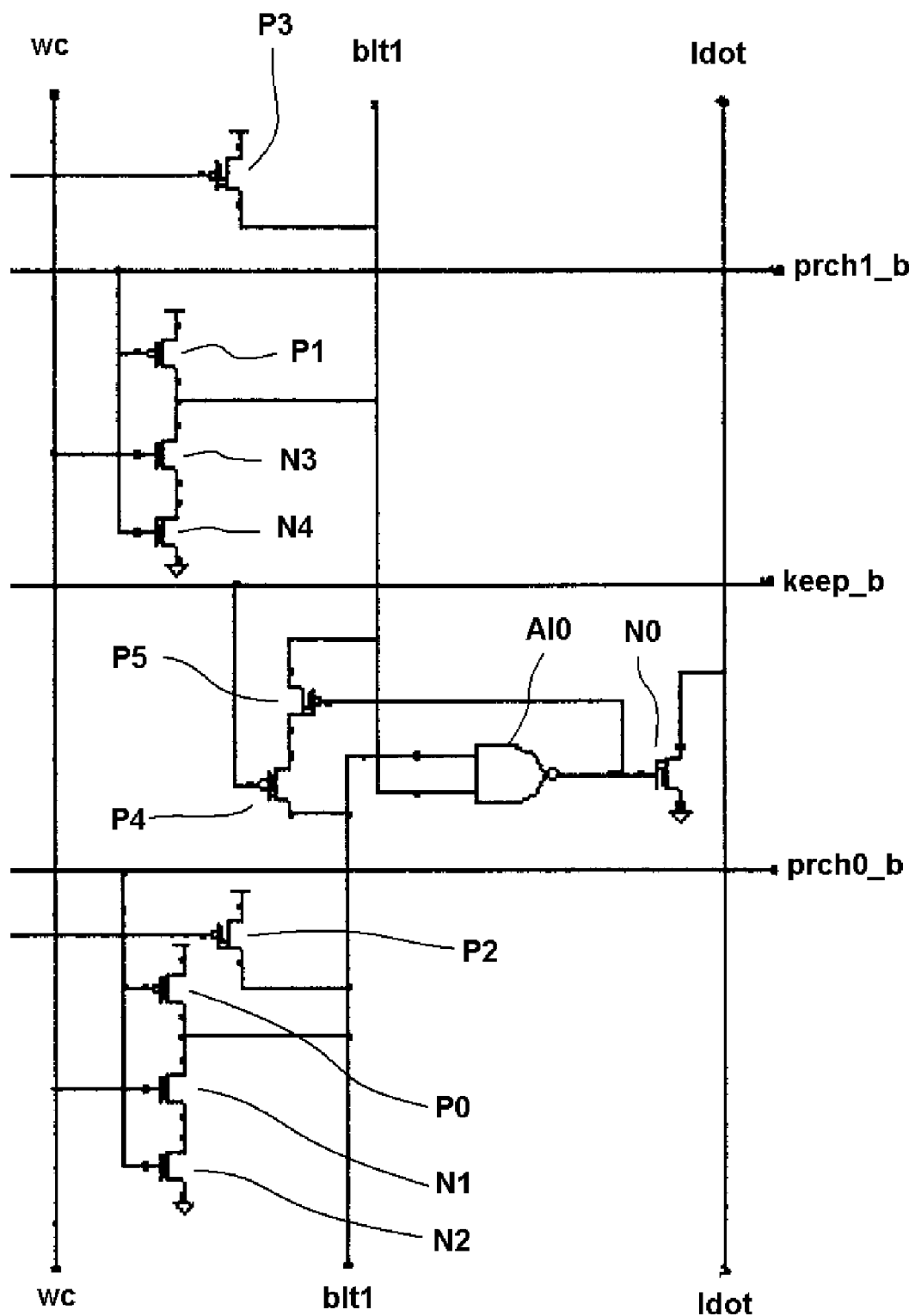
FIG. 2 shows a schematic circuit enabling read, write and write back operations for asymmetric memory cells and protects a floating bit-line against read signal loss due to leakage.

FIG. 2 describes a circuitry supporting state of the art domino sensing scheme for read as well as novel write back and write operations.

Domino sensing requires cells of a column to be partitioned in groups. Each group is connected to its own separate bit-line blt whereas the complementary bit-line blc is common to all cells of all groups in a column.

The circuitry which senses and drives a group of cells is named 'local eval'. To share devices a local eval actually serves two groups.

The bit-lines blt coming from two groups are named in FIG. 2 to blt0 and blt1. They are fed to a nand gate AIO and this drives a n-device (NO) connected between ground and a global bit-line named ldot which is common for all groups in a column and connects thus the local eval circuits of the groups.

The bit-lines blt1 and blt0 are precharged after any read or write operation. When the precharge signals prch0_b and prch1_b are low bit-lines blt0 and blt1 are charged to up level and are prepared for reading a cell in the next cycle.

To start a read or write simultaneously with wl said signals prch0_b or prch1_b are turned to up level which serves the bit-line with the selected cell. Either p-device p0 or p1 between power supply and blt0 or blt1 is turned off. Thus blt0 or blt1 can be controlled by the selected cell.

Depending on the cell's content the bit-line stays up or falls. By a circuitry not shown the global bit-line ldot is restored to up level before a read operation and pulled down when either blt0 or blt1 is falling via nand gate AIO and n-device NO. The global bit-line carries the read information of a column.

An up level on the bit-lines cannot be enforced by the memory cell but as a result the bit-line is floating. The occurring leakage has to be compensated. To achieve that signal keep_b is activated. Signal keep_b is falling whenever one of the precharge signals prch0_b or prch1_b is pulled high. But the activation of signal keep_b is delayed. The delay is made hardly longer than it takes to propagate a low level from blt0 or blt1 via the nand gate AIO to a feedback device p5. It is in series to the p-device p4 driven by signal keep_b. The feedback device is turned off when one of blt0 or blt1 is falling. When keep_b is at down level and bit-lines stay at up level both p-devices are open and connect blt0 to blt1. Always one bit-line is kept restored actively.

Thus leakage from the floating bit-line is compensated. For most applications one or more columns may be selected for reading and simultaneously one or more columns may be selected for writing. To enable this both row selecting wordlines wl and wwl are applied during this combined operation. But they are staggered, with the signal on wordline wwl delayed. On columns to be read signal wt_b is kept inactive at up level and signal wc also inactive at down level. Both signals are common to all local eval circuits in a column. With the activation of wordline wl all cells in a row are propagating data to their global bit-line ldot. In a not shown inverter the signal on ldot is amplified and applied to blc of that column it came from. The wordline wwl is activated after the time the propagation would need from bit-line blt via global bit-line ldot to bit-line blc. Then that level is applied via bit-line blc to the memory cell which matches the content of the memory cell. The content of the memory cell is undisturbed.

For columns to be written the global bit-line ldot is forced during interval of an active wordline wl. It is forced to that level which corresponds to the data to be written. This is achieved with global lines wt_b and wc. In case of writing an 'one', wc is kept low and wt_b is pulled low. Wt_b forces blt0 and blt1 via connected p devices p2 and p3 to up level thus overturning what the selected cell may supply. When the signal on wordline wwl is turned on bit-line blc is at down level, completing the write of a 'one'. For writing a 'zero' wc is pulled up and wt_b is kept up. Via the stacked devices N1, N2 or N3, N4 one of the bit-lines blt0 or blt1 is pulled down, depending on which prch0_b or prch1_b is positive. The selected cell is written to 'zero'. Later pulled up bit-line blc confirms the writing 'zero'.

The control circuitries performs writing of memory cells on selected columns while memory cells on other unselected columns but on same selected row are read.

The invention claimed is:

1. Asymmetrical random access memory cell (1) comprising cross coupled inverters (2, 3) which are driven at their nodes (22, 32) by separate bit-lines (blt, blc) of a pair of complementary bit-lines, which are connected via a pass-transistors (21, 31), characterized in, that said cross coupled inverters (2, 3) have different switching thresholds providing asymmetrically physical behaviours, and that the pass-transistors (21, 31) are driven by separate controlled wordlines (wl, wwl).

2. Random access memory comprising a plurality of asymmetrical random access memory cells according to claim 1 arranged in columns and rows, wherein a circuitry is provided controlling the separate wordlines (wl, wwl).

3. Random access memory according to claim 2, characterized in, that the cells of a column are partitioned in groups, wherein the first nodes of the cells of each group are connected to a separate bit-line (blt) whereas the bit-line (blc) connected to the second nodes is common to all cells of all groups within a column.

* * * * *